(12) United States Patent
Ishii

(10) Patent No.: US 9,806,020 B1
(45) Date of Patent: Oct. 31, 2017

(54) SEMICONDUCTOR DEVICE

(71) Applicant: KABUSHIKI KAISHA TOSHIBA, Minato-ku, Tokyo (JP)

(72) Inventor: Yoshiaki Ishii, Oita (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 15/255,257

(22) Filed: Sep. 2, 2016

(30) Foreign Application Priority Data

Apr. 26, 2016 (JP) .................................. 2016-088421

(51) Int. Cl.
*H01L 49/02* (2006.01)
*H01L 23/522* (2006.01)
*H01L 27/08* (2006.01)

(52) U.S. Cl.
CPC ...... *H01L 23/5228* (2013.01); *H01L 27/0802* (2013.01); *H01L 28/20* (2013.01); *H01L 28/24* (2013.01)

(58) Field of Classification Search
CPC ...... H01L 28/20; H01L 28/24; H01L 23/5228
See application file for complete search history.

(56) References Cited

U.S. PATENT DOCUMENTS

| 6,759,729 B1* | 7/2004 | Racanelli | ............ H01L 27/0802 257/536 |
| 2010/0156588 A1* | 6/2010 | Privitera | ................. H01C 7/06 338/7 |

FOREIGN PATENT DOCUMENTS

| JP | 2005-236195 A | 9/2005 |
| JP | 2011-138991 A | 7/2011 |
| JP | 2013-243276 A | 12/2013 |

* cited by examiner

*Primary Examiner* — Ermias Woldegeorgis
(74) *Attorney, Agent, or Firm* — Foley & Lardner LLP

(57) ABSTRACT

A semiconductor device that includes a first wiring, a second wiring, and a first number of first resistance elements that are connected in parallel between the first wiring and the second wiring, and each of which has a negative first temperature coefficient. The semiconductor device further includes a second number of second resistance elements that are connected in parallel to the first resistance elements, each of which has a positive second temperature coefficient, the second temperature coefficient having an absolute value larger than an absolute value of the first temperature coefficient. The second number is smaller than the first number.

15 Claims, 8 Drawing Sheets

SEMICONDUCTOR DEVICE

CROSS-REFERENCE TO RELATED APPLICATION

This application claims the benefit of and priority to Japanese Patent Application No. 2016-088421, filed Apr. 26, 2016; the entire contents of which are incorporated herein by reference.

FIELD

Embodiments described herein relate generally to a semiconductor device.

BACKGROUND

Generally, a semiconductor device includes a substrate on which a semiconductor element is formed, a wiring provided on the substrate and a resistance element and the like. The semiconductor device is sometimes used in an environment in which ambient temperature changes. The resistance element has temperature dependency, and, when the resistance value is changed with temperature, desired output voltage cannot be obtained. Therefore, it is necessary to reduce the variation range of the resistance value due to temperature change. A characteristic representing the change in the resistance value due to temperature change is a Temperature Coefficient of Resistance ("TCR"). TCR can be a negative or positive temperature coefficient, and, when the absolute value thereof is small, the variation range of the resistance value due to temperature is small. Conventionally, a resistance element having a positive temperature coefficient, and a resistance element having a negative temperature coefficient are combined to offset the positive temperature coefficient and the negative temperature coefficient, thereby, the magnitude of the combined TCR is reduced. Tantalum nitride has been used as the material. However, when the tantalum nitride having a negative temperature coefficient is used, in order to obtain a positive temperature coefficient, the thickness of the film is increased, which increases the element size.

SUMMARY

In some embodiments according to one aspect, a semiconductor device includes a first wiring, a second wiring, and a first number of first resistance elements that are connected in parallel between the first wiring and the second wiring, and each of which has a negative first temperature coefficient. The semiconductor device further includes a second number of second resistance elements that are connected in parallel to the first resistance elements, and each of which has a positive second temperature coefficient, the second temperature coefficient having an absolute value larger than an absolute value of the first temperature coefficient. The second number is smaller than the first number.

In some embodiments according to another aspect, a semiconductor device includes a semiconductor substrate, a plurality of contacts, a first insulating layer provided above the semiconductor substrate, a second insulating layer provided above the first insulating layer, and a third insulating layer provided above the second insulating layer. The semiconductor device further includes a second resistance element provided in the first insulating layer having a positive second temperature coefficient, and a first resistance element provided in the second insulating layer having a negative first temperature coefficient, the second temperature coefficient having an absolute value larger than an absolute value of the first temperature coefficient. The semiconductor device further includes a first wiring provided in the third insulating layer, to which one end of the first resistance element is connected through at least one of the plurality of contacts and to which one end of the second resistance element is connected through at least one of the plurality of contacts, and a second wiring provided in the third insulating layer, to which another end of the first resistance element is connected through at least one of the plurality of contacts and to which another end of the second resistance element is connected through at least one of the plurality of contacts.

In some embodiments according to another aspect, a semiconductor device includes a first terminal, a second terminal, a first resistance element having a negative temperature coefficient, and a second resistance element having a positive temperature coefficient which are connected in series between the first terminal and the second terminal. The semiconductor device further includes a resistance lead end and at least one lead wiring that connects the resistance lead end to a region of one of the first resistance and the second resistance having a smaller resistance value.

In some embodiments according to another aspect, a semiconductor device includes a first terminal, a second terminal, a first resistance lead end, and a second resistance lead end. The semiconductor device further includes a first resistance region forming a first resistance having a negative temperature coefficient, a first wiring region having a positive temperature coefficient, and connecting the first resistance region to the first terminal, a second wiring region having a positive temperature coefficient, and connecting the first resistance region to the second terminal, a first lead wiring that connects a region in the first wiring region to the first resistance lead end, and a second lead wiring that connects a region in the second wiring region to the second resistance lead end.

Other aspects and embodiments of the disclosure are also encompassed. The foregoing summary and the following detailed description are not meant to restrict the disclosure to any particular embodiment but are merely meant to describe some embodiments of the disclosure.

DETAILED DESCRIPTION

According to some embodiments, there is provided a semiconductor device capable of suppressing a change in a resistance value due to temperature change.

In general, according to some embodiments, a semiconductor device includes: a first wiring; a second wiring; a plurality of first resistance elements that are connected in parallel between the first wiring and the second wiring, and each of which has a negative temperature coefficient with a small temperature change rate; and one or more second resistance elements that are connected in parallel to the first resistance elements, and each of which has a positive temperature coefficient with a temperature change rate larger than a positive temperature coefficient of the first resistance elements, the number of the second resistance elements being smaller than the number of the first resistance elements.

A first embodiment will now be described with reference to the accompanying drawings. In the description and the claims that follow, a "resistance" may refer to a resistance value of a particular component or may refer to a plurality of components that together have an effective resistance value. Note that the same numbers are assigned to the same or similar components in each drawing and detailed description thereof may be omitted as appropriate.

First Embodiment

Figure 1:
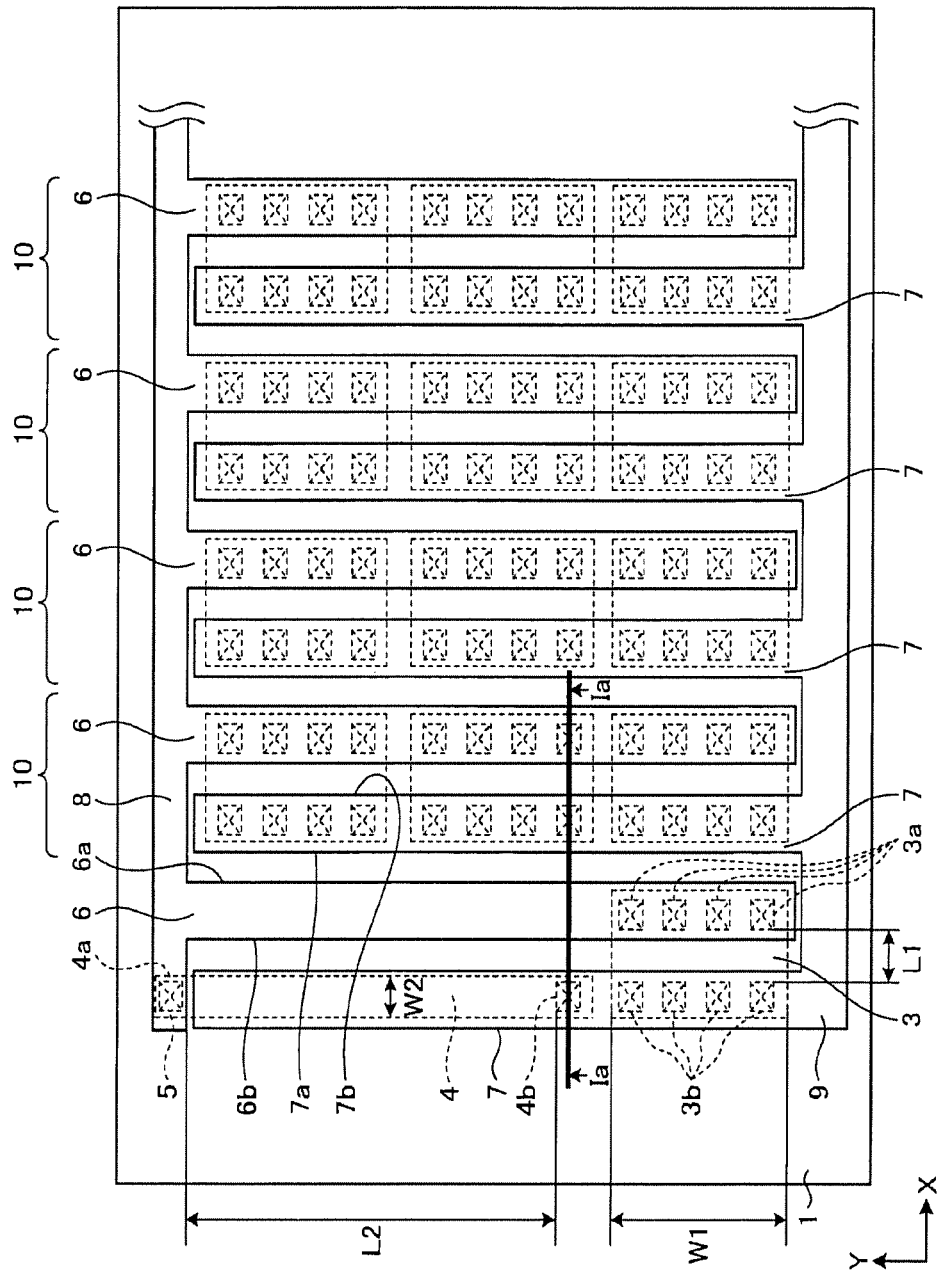
FIG. 1 is a top view showing a configuration of a semiconductor device according to a first embodiment.
Figure 2:
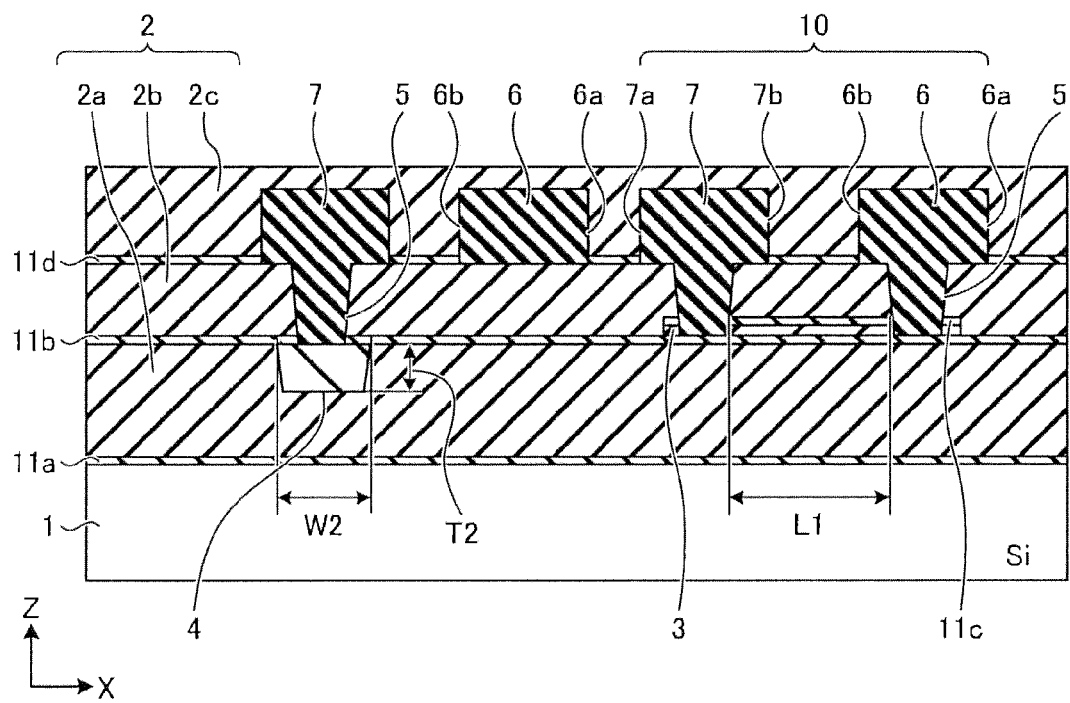
FIG. 2 is a schematic partial cross-sectional view of the semiconductor device along Ia-Ia shown in FIG. 1.
Figure 3:
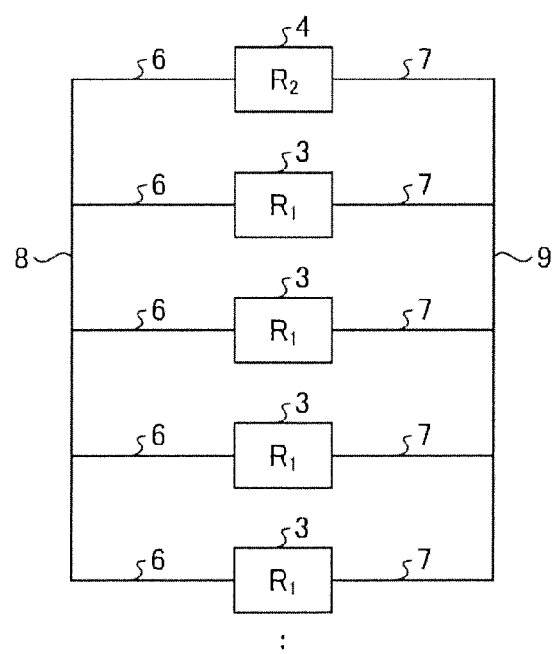
FIG. 3 is a corresponding circuit diagram showing resistance elements according to the first embodiment.

A semiconductor device according to a first embodiment will be described with reference to FIG. 1 to FIG. 3. FIG. 1 is a top view showing a configuration of a semiconductor device according to the first embodiment. FIG. 2 is a schematic partial cross-sectional view of the semiconductor device along Ia-Ia shown in FIG. 1. FIG. 3 is a corresponding circuit diagram showing resistance elements according to the first embodiment.

A semiconductor device according to the first embodiment includes: a semiconductor substrate 1, an insulating layer 2, a first resistance element 3, a second resistance element 4, a contact 5, a first wiring 6, a third wiring 8 integrally continuous with the first wiring 6, a fourth wiring 9 integrally continuous with a second wiring 7 and the like.

As explained in more detail below, in some embodiments, the first resistance element 3 can be provided under the first wiring 6 and the second wiring 7. Further, the second resistance element 4 can be provided below the second wiring 7.

In some embodiments, the second resistance element 4 may be provided in an insulating layer closer to the semiconductor substrate 1 than is the first resistance element 3, or may be provided in the same insulating layer as the first resistance element 3.

For convenience, this description will first refer to FIG. 2, and then to FIG. 1. The relationship of wirings and resistance elements in the semiconductor device according to the first embodiment shown in FIG. 1 will be described with reference to the cross-sectional view of FIG. 2.

FIG. 2 is a schematic partial cross-sectional view of the first embodiment of the semiconductor device along the line Ia-Ia shown in FIG. 1.

The insulating layer 2 is provided on the semiconductor substrate 1. The semiconductor substrate 1 can be made of or can include silicon, for example. In the first embodiment, the insulating layer 2 includes a first insulating layer 2a, a second insulating layer 2b and a third insulating layer 2c.

The first insulating layer 2a is provided on the semiconductor substrate 1 over a layer of silicon nitride (SiN) 11a. The second resistance element 4 is provided in the first insulating layer 2a. The phrase provided in a layer may refer to a component or element being embedded in the layer, where some, but not necessarily all, of the component or element may be encapsulated by the layer. The second resistance element 4 can be made of or can include, for example, a metal material. An example of the metal material includes copper (Cu), aluminum (Al), copper-added aluminum, tungsten (W) and gold (Au). When the second resistance element 4 is made of copper, it can be formed by using a damascene method or a dual damascene method, for example. A barrier metal can be provided on each side surface of the second resistance element 4. The barrier metal can be made of or can include, for example, titanium nitride (TiN) or tantalum nitride (TaN).

The second insulating layer 2b is provided on the first insulating layer 2a over a layer of silicon nitride 11b, for example. The first resistance element 3 is provided in the second insulating layer 2b. The first resistance element 3 is can be made of or can include, for example, a semiconductor material. An example of the semiconductor material includes tantalum nitride (TaN) and chromium silicon. Silicon nitride (SiN) 11c is provided on the first resistance element 3. Further, the contact 5 is provided on the second insulating layer 2b. The contact 5 can be, for example, a via filled with conductive material. As shown in FIG. 2, the contact 5 connects the first wiring 6 and the second wiring 7 provided in the third insulating layer 2c with the first resistance element 3. Further, another contact 5 connects the second wiring 7 provided in the third insulating layer 2c with the second resistance element 4 provided in the first insulating layer 2a. The material of the contact 5 can include, for example, aluminum (Al).

The third insulating layer 2c is provided on the second insulating layer 2b over a layer of silicon nitride 11d, for example. In the third insulating layer 2c, a plurality of first wirings 6 and a plurality of second wirings 7 are alternately spaced in the X direction, with the X direction being the direction shown in FIG. 2. In the third insulating layer 2c, the third wiring 8 for connecting the plurality of first wiring 6 is provided, and can constitute a portion of the first wirings 6 (shown in FIG. 1). Further, the fourth wiring 9 for connecting the plurality of second wiring 7 is provided, and can constitute a portion of the second wirings 7 (shown in FIG. 1).

The first insulating layer 2a, the second insulating layer 2b and the third insulating layer 2c are formed of or include, for example, a TEOS (Tetra Ethylortho Silicate) film or a silicon oxide film. The thickness of each of the first insulating layer 2a, the second insulating layer 2b and the third insulating layer 2c is, for example, 700 nanometers ("nm") to 1000 nm (thickness being measured in a Y direction that is orthogonal to the X direction, as depicted in FIG. 1). Further, in the case of a product having high breakdown voltage, the thickness of each film is about 1000 nm to 2500 nm.

Hereinafter, the size of each wiring, wiring and connection relationship and the like will be described in detail with reference to FIG. 1.

The plurality of first wirings 6, which extend in the Y direction orthogonal to the X direction, are provided at predetermined intervals along the X direction. Each of the first wirings 6 has a first side surface 6a and a second side surface 6b opposite to the first side surface 6a.

The plurality of second wirings 7, extending in the Y direction, are provided at predetermined intervals along the X direction, and the first wirings 6 and the second wirings 7 are arranged alternately in the X direction. Each of the second wirings 7 has a third side surface 7a and a fourth side surface 7b opposite to the third side surface 7a. Accordingly, as shown in FIG. 2, the third side surface 7a faces the first side surface 6a, and the fourth side surface 7b faces the second side surface 6b. As described above, a pair of the first wiring 6 and the second wiring 7 has a structure in which the second side surface 6b and the fourth side surface 7b face each other, and a number of the first resistance elements 3 are electrically connected to both the first wiring 6 and the second wiring 7 through the contact 5. In FIG. 1, the first resistance elements 3 are depicted as dashed-line rectangles that are each provided over eight contacts 5. In other embodiments, the resistance elements 3 may not be rectangular and may be provided over a different number of contacts 5. Note that, the structure in which the first wiring 6 and the second wiring 7 are connected to a plurality of first resistance elements 3 is herein referred to as a wiring block 10. In embodiments in which a plurality of first resistance element 3 are connected in parallel to the wiring block 10, when a plurality of wiring blocks 10 are provided, the overall resistance value of the first resistance elements 3 of the wiring block 10 is reduced.

The third wiring 8 is provided in the same layer as the first wirings 6. Further, the third wiring 8 extends in the X direction, and is integrally formed with the first wirings 6. The third wiring 8 may be considered to be a horizontally (along the X direction) extended component of the first wiring 6 that may connect vertically (along the Y direction) to extended sections of the first wiring 6. Note that the first wirings 6 and the third wiring 8 may be provided in different layers as long as each of the first wirings 6 and the third wiring 8 are electrically connected to each other.

The fourth wiring 9 is provided in the same layer as the second wirings 7. Further, the fourth wiring 9 extends in the X direction just like the third wiring 8, and is integrally formed with the second wirings 7. The fourth wiring 9 may be considered to be a horizontally (along the X direction) extended component of the second wiring 7 that may connect vertically (along the Y direction) to extended sections of the second wiring 7. Note that the second wirings 7 and the fourth wiring 9 may be provided in different layers as long as each of the second wirings 7 and the fourth wiring 9 are electrically connected to each other.

In the first embodiment depicted in FIG. 1, one end 3a of one first resistance element 3 (depicted in FIG. 1 as a left side of the first resistance element 3) is connected to the first wiring 6 through one contact 5, and the other end 3b (depicted in FIG. 1 as a right side of the first resistance element 3) thereof is connected to the second wiring 7 through another contact 5. A plurality of first resistance elements 3 connected to the first wiring 6 and the second wiring 7 are provided in the Y direction. In the first embodiment, it is assumed that three first resistance elements 3 are connected to the first wiring 6 and the second wiring 7. The first resistance elements 3 are connected in parallel, respectively. Each of the first resistance elements 3 is made of a material having a negative temperature coefficient. In other embodiments, at least one but not all of the first resistance elements 3 are made of a material having a negative temperature coefficient. Here, a negative temperature coefficient means that a resistance value increases with decreasing temperature, and a positive temperature coefficient means that a resistance value increases with increasing temperature. Note that the semiconductor devices described herein are not limited to structures in which a plurality of first resistance elements 3 are connected in parallel in the Y direction. For example, in some embodiments, a single resistance element 3 may be used.

The resistance value of the resistance element can be determined by the length and the width of the resistance element and the sheet resistance. The sheet resistance refers to a resistivity indicating the resistance per unit area. In the embodiment, assuming that the length of the first resistance element 3 in the Y direction is width W1, and the length between the contacts 5 in the X direction is L1, when the width W1 and the length L1 of the first resistance element 3 is adjusted or selected, the resistance value of the first resistance element 3 can be adjusted or selected.

The second resistance element 4 extends in the Y direction. One end 4a of one second resistance element 4 is connected to the third wiring 8 through the contact 5, and the other end 4b thereof is connected to the second wiring 7 through the contact 5. The second resistance element 4 has a positive temperature coefficient, and is made of a material having a sheet resistance smaller than that of the first resistance element 3. Assuming that the length of the second resistance element 4 in the X direction is width W2, and the length between the contacts 5 in the Y direction is length L2, the resistance value of the second resistance element 4 is adjusted or selected with the width W2 and the length L2. The length L2 of the second resistance element 4 in the embodiment is longer than the length L1 of the first resistance element 3, and the width W2 of the second resistance element 4 is narrower than the width W1 of the first resistance element 3.

A corresponding circuit of the first resistance elements 3 and one second resistance element 4 described above is as shown in FIG. 3.

Next, operation of the embodiment and some effects of the operation will be described.

In the below described example that involves the first embodiment, it is assumed that the resistance value before any temperature change of the first resistance element 3 is $R_1$, the resistance value after a temperature change of the first resistance element 3 is $R_1'$, the resistance value before the temperature change of the second resistance element 4 is $R_2$, and the resistance value after the temperature change of the second resistance element 4 is $R_2'$. Further, it is assumed that the first resistance element 3 is made of tantalum nitride having a negative temperature coefficient, and the second resistance element 4 is made of copper or aluminum having a positive temperature coefficient. The absolute value of the TCR of the tantalum nitride is smaller than that of copper or aluminum. When the second resistance element 4 having the TCR larger than that of the first resistance element 3 and the first resistive element 3 are connected in parallel, variation of the resistance value due to temperature change of the combined resistance is smaller when the number of the second resistance elements 4 is low, and the number of the first resistance elements 3 is large. In the first embodiment, the number of the first resistance elements 3 is larger than the number of the second resistance elements 4. Further, the length L2 and the width W2 of the second resistance element 4 having the sheet resistance smaller than that of the first resistance element 3, and the length L1 and the width W1 of the first resistance element 3 are adjusted or selected such that the resistance values may be substantially the same, or the resistance value $R_2$ of the second resistance element 4 may be smaller than the resistance value $R_1$ of the first resistance element 3 (note that in the description of some embodiments, when referring to two values or characteristics as being substantially the same or equal, the terms can refer to a first value or characteristic being precisely the same or equal to a second value or characteristic, as well as cases where the first value or characteristic is within a range of variation of less than or equal to ±5% of the second value or characteristic, such as less than or equal to ±4%, less than or equal to ±3%, less than or equal to ±2%, or less than or equal to ±1%). This is because the difference between the resistance value $R_2'$ and the resistance value $R_1'$ after the temperature change is prevented from becoming larger because the TCR of the second resistance element 4 is large. In the first embodiment, any dependency of the resistance value of the resistance element on the thickness of the resistance element may be disregarded because the resistance element is thin. It is assumed that the sheet resistance of the first resistance element 3 is $R_{S1}$, and the sheet resistance of the second resistance element 4 is $R_{S2}$. Each resistance value is expressed as follows:

$$R_1 = R_{S1} \times L1/W1 \quad \text{(Equation 1)}$$

$$R_2 = R_{S2} \times L2/W2 \quad \text{(Equation 2)}$$

At this time, each value of the sheet resistance is expressed as follows:

$$R_{S1} = (TCR_1 \times \Delta T + R_{S10}) \quad \text{(Equation 3)}$$

$$R_{S2} = (TCR_2 \times \Delta T + R_{S20}) \quad \text{(Equation 4)}$$

$TCR_1$ is the TCR of the first resistance element 3, and $TCR_2$ is the TCR of the second resistance element 4. $R_{S10}$ is the sheet resistance of the first resistance element 3 when the temperature is 0° C., and $R_{S20}$ is the sheet resistance of the second resistance element 4 when the temperature is 0° C.

The resistance value of the first resistance element 3 is reduced with increasing temperature. On the other hand, the resistance value of the second resistance element 4 is increased with increasing temperature. Further, since the TCR of the second resistance element 4 is larger than that of the first resistance element 3, the rate of change of the resistance value of the second resistance element 4 is larger than that of the first resistance element 3. Therefore, when the resistance value $R_2$ of the second resistance element 4 before the temperature change is adjusted or selected so as to be smaller than the resistance value $R_1$ of the first resistance element 3 before the temperature change, the resistance value $R_2'$ of the second resistance element 4 after the temperature change can approximate to the resistance value $R_1'$ of the first resistance element 3 after the temperature change. The resistance value of the second resistance element 4 may be smaller than the resistance value of the first resistance element 3 at an initial temperature, but may catch up to and become substantially equal to the resistance value of the first resistance element 3 after an increase in temperature, because the rate of change of the resistance value of the second resistance element 4 with respect to temperature is positive and is larger than that of the first resistance element 3.

Considerations for selection of or adjustment of the length L and the width W of the resistance elements will now be described.

In the first embodiment, the length L2 of the second resistance element 4 is longer than the length L1 of the first resistance element 3, and the width W2 of the second resistance element 4 is narrower than the width W1 of the first resistance element 3. The second resistance element 4 is made thinner than first resistance element 3 and can be connected between the first wiring 6 and the second wiring 7 in the first insulating layer 2a, thereby improving the degree of freedom in design and manufacture. Further, the first resistance element 3 is wider than the resistance element 4. In addition, by suitably adjusting or selecting the respective lengths L and widths W of the first resistance element 3 and the second resistance element 4, it is easy to relatively increase the resistance value $R_1$ of the first resistance element 3 as compared to the resistance value $R_2$ of the second resistance element 4. Accordingly, when the resistance value $R_1$ of the first resistance element 3 is made to be larger than the resistance value $R_2$ of the second resistance element 4, although there is a difference between the resistance values $R_1$ and $R_2$ before the temperature change, the difference between the resistance values $R_2'$ and $R_1'$ after the temperature change of the second resistance element 4 having larger TCR is not increased. Thus, it is possible to suppress variation of the resistance value due to temperature change. In adjustment or selection as described above, as shown in FIG. 1 or FIG. 2, when the first resistance element 3 is provided in the second insulating layer 2b, and the second resistance element 4 is provided in the first insulating layer 2a, respectively, and a plurality of first resistance elements 3 are connected in parallel and arranged in the second insulating layer 2b, the change in the resistance value due to temperature change of the first resistance element 3 is reduced, thereby facilitating the adjustment or selection of the resistance value $R_2'$ after the temperature change of the second resistance element 4.

As described above, the first resistance element 3 having a negative temperature coefficient, and the second resistance element 4 having a positive temperature coefficient are used to adjust or select the width W and the length L of the respective resistance elements. Thus, it is possible of suppress variation of the resistance value due to temperature change. In the embodiment, by using a second resistance element 4 having a positive temperature coefficient, difficulty in film thickness adjustment of tantalum nitride, and a decrease in yield due to heat treatment can be suppressed. Further, it is possible to downsize the semiconductor device by connecting the first resistance elements 3 and the second resistance element 4 in parallel.

Further, by providing the wiring block 10 in which the second wiring 7 and the fourth wiring 9 are adjacent, current uniformly flows through the wirings. The current uniformly flows through the wirings. Thus, it is possible to suppress current concentration and a change in resistance value due to temperature change.

Second Embodiment

Figure 4:
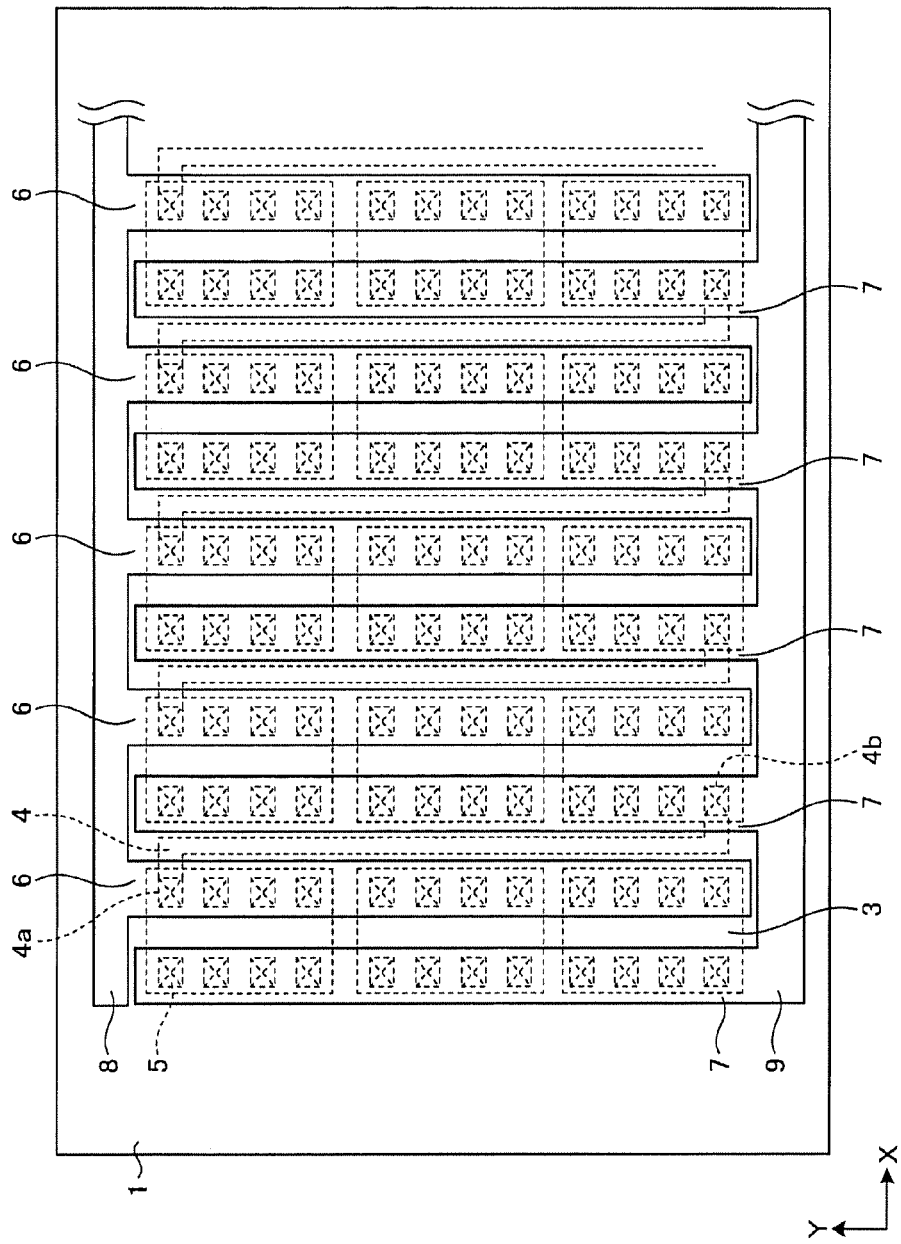
FIG. 4 is a top view showing a configuration of a semiconductor device according to a second embodiment.
Figure 5:
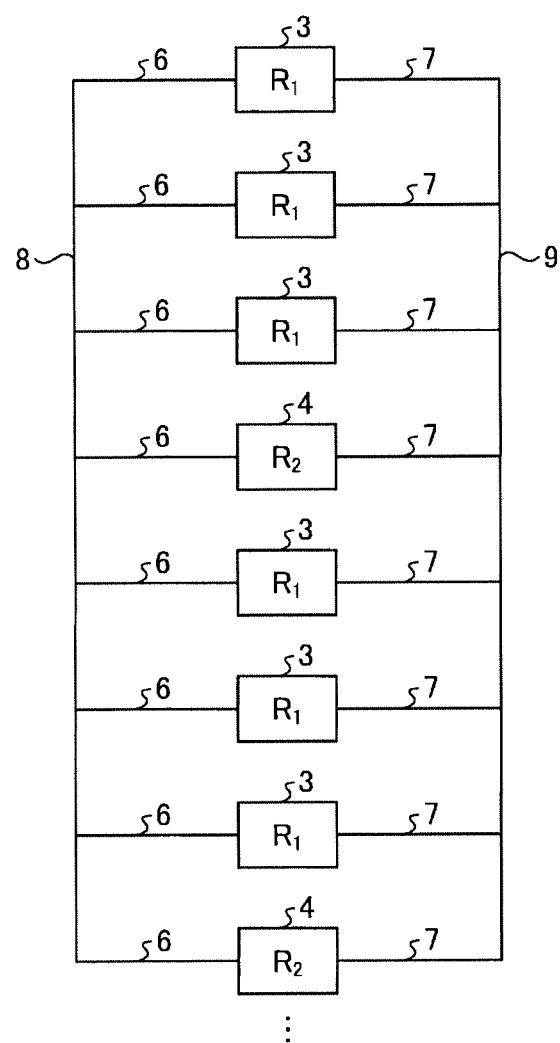
FIG. 5 is a corresponding circuit diagram showing resistance elements according to the second embodiment.

A semiconductor device according to a second embodiment will be described with reference to FIG. 4 and FIG. 5. FIG. 4 is a top view showing a configuration of the semiconductor device according to the second embodiment. FIG. 5 is a corresponding circuit diagram showing resistance elements according to the second embodiment.

The semiconductor device according to the second embodiment can differ in some ways from that according to the first embodiment. For example, one end 4a of the second resistance element 4 is connected to the first wiring 6 and the other end 4b thereof is connected to the second wiring 7, and the first resistance elements 3 are arranged on both sides of the second resistance element 4 when viewed from the upper surface. The semiconductor device according to the second embodiment can have a similar structure to that of the semiconductor device according to the first embodiment except for the above points. Accordingly, the same numbers are assigned to the same or similar portions or components depicted in FIGS. 4 and 5, and detailed description thereof is omitted.

The structure of the semiconductor device according to the second embodiment will be described.

One end 4a of the second resistance element 4 is connected to the first wiring 6, and the other end 4b thereof is connected to the second wiring 7. The first resistance elements 3 are arranged on both sides of the second resistance element 4 when viewed from the upper surface. That is, as shown in FIG. 4, a number of first resistance elements 3 and a lesser number of the second resistance elements 4 are connected in parallel. The length L2 of the second resistance element 4 is longer than the length L1 of the first resistance element 3, and the width W2 of the second resistance element 4 is narrower than the width W1 of the first resistance element 3. The second resistance element 4 can be freely connected between the first wiring 6 and the second wiring 7 in the first insulating layer 2a, thereby improving the degree of freedom in design and manufacture. In addition, the number of the parallel connections of the first resistance elements 3 and the second resistance elements 4 is increased. In the second embodiment, the resistance value of the combined resistance of the first resistance elements 3 and the second resistance elements 4 is small as compared with the case of the series connection, and variation of the resistance value is also small even when the ambient temperature varies. Thus, it is possible to provide a stable semiconductor device.

Third Embodiment

Figure 6:
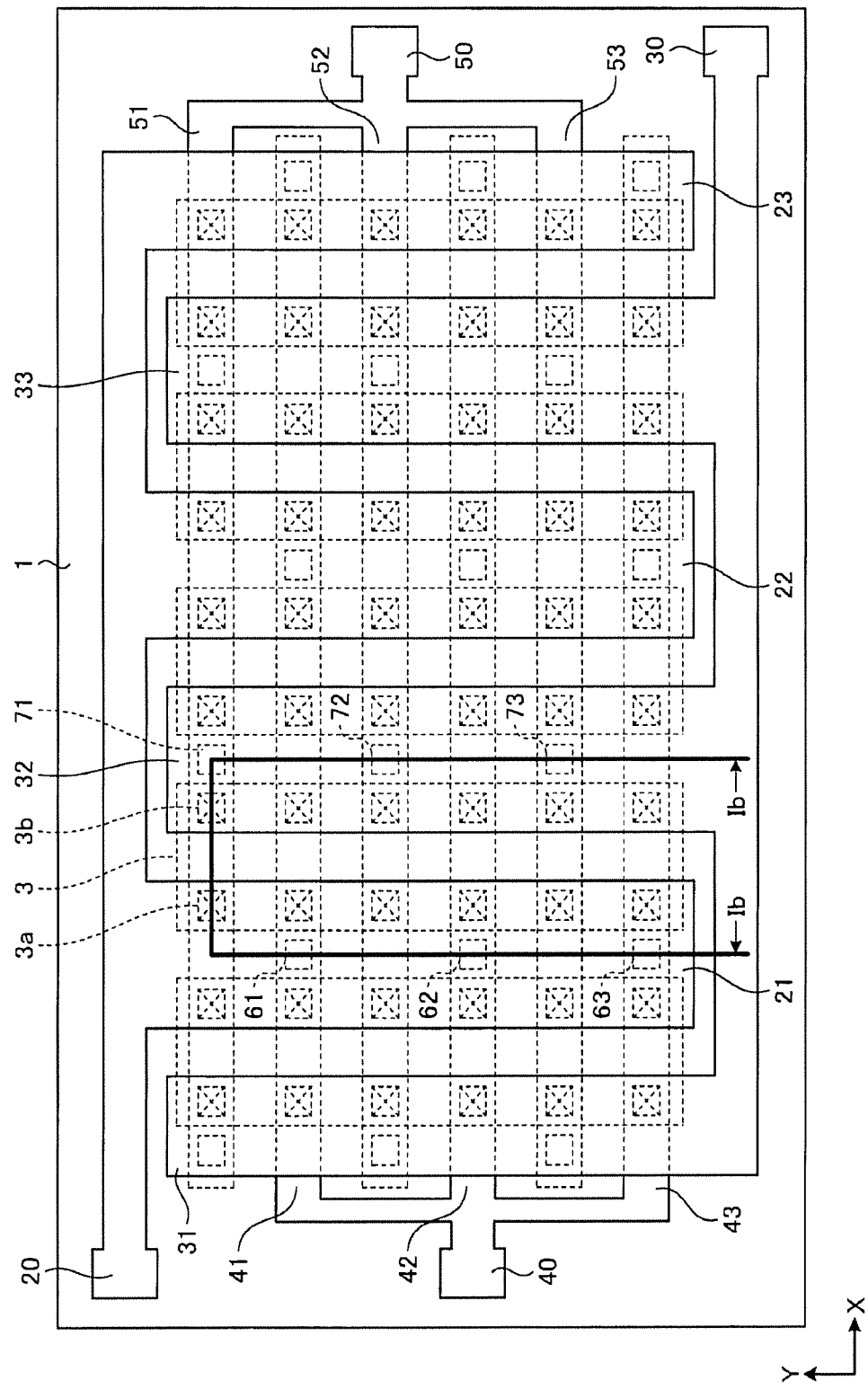
FIG. 6 is a top view showing a configuration of a semiconductor device according to a third embodiment.
Figure 7:
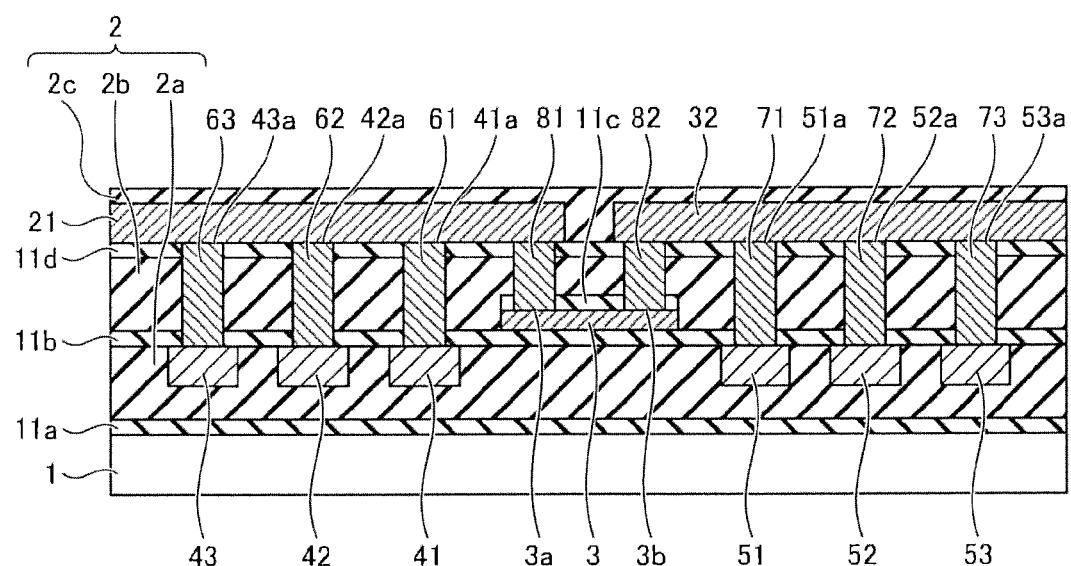
FIG. 7 is a schematic partial cross-sectional view of the semiconductor device along Ib-Ib shown in FIG. 6.
Figure 8:
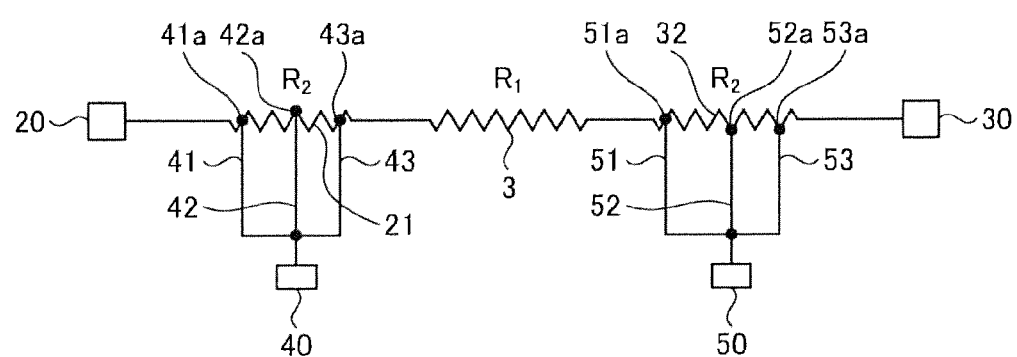
FIG. 8 is a corresponding circuit diagram showing resistance elements according to the third embodiment.

A semiconductor device according to a third embodiment will be described with reference to FIG. 6 through FIG. 8. The components corresponding to above-described embodiments are denoted by the same reference numerals. FIG. 6 is a top view showing a configuration of the semiconductor device according to the third embodiment. FIG. 7 is a schematic cross-sectional view of the semiconductor device along Ib-Ib shown in FIG. 6. FIG. 8 is a simplified corresponding circuit diagram showing resistance elements of the semiconductor device according to the third embodiment.

The semiconductor device according to the embodiment has, on the semiconductor substrate 1, a plurality of input wirings 21, 22 and 23 extending in the Y direction (as shown in FIG. 6) at predetermined or substantially equal intervals. The input wirings 21, 22 and 23 may form a resistance region, and each input wiring 21, 22 or 23 may be referred to as a branch of the resistance region. One end of each input wiring is open, and the other end is connected to a current input end 20. Each input wiring 21, 22 or 23 is connected to input side resistance lead wirings 41, 42 and 43.

A plurality of output wirings 31, 32 and 33 extending in the X direction at predetermined or substantially equal intervals are provided on the semiconductor substrate 1. The output wirings 31, 32 and 33 may form a resistance region, and each input wiring 21, 22 or 23 may be referred to as a branch of the resistance region. One end of each output wiring is open, and the other end is connected to a current output end 30. Each output wiring 31, 32 or 33 is connected to output side resistance lead wirings 51, 52 and 53.

The first resistance element 3 having a negative temperature characteristic is formed on the semiconductor substrate 1. The first resistance element 3 is made of, for example, tantalum nitride (TaN) or chrome silicon. A first resistance element end 3a of the first resistance element 3 is connected to an input wiring 21 through a contact 81 (as shown in FIG. 7). The other first resistance element end 3b of the first resistance element 3 is connected to an output wiring 32 through a contact 82 (as shown in FIG. 7). The input wirings 21, 22 and 23 and the output wirings 31, 32 and 33 can be made of or can include, for example, copper or aluminum having a positive temperature coefficient. That is, the input wirings 21, 22 and 23 and output wirings 31, 32 and 33 are resistance regions having a positive temperature coefficient. The first resistance element 3 having a negative temperature coefficient, and the input wirings 21, 22 and 23 and the output wirings 31, 32 and 33 having a positive temperature coefficient are connected in series between the current input end 20 and the current output end 30.

The semiconductor device according to the embodiment has, on the semiconductor substrate 1, the plurality of input side resistance lead wirings 41, 42 and 43 extending in the X direction at predetermined intervals. One end of each wiring is open, and the other end thereof is connected to a first resistance lead end 40. The input side resistance lead. wirings 41, 42 and 43 are each connected to each of the input wirings 21, 22 and 23 through the contacts 61, 62 and 63, respectively. For example, the input wiring 21 is connected to each of the input side resistance lead wirings 41, 42 and 43 at connection portions 41a, 42a and 43a (as shown in FIG. 7).

The semiconductor device according to the embodiment has, on the semiconductor substrate 1, a plurality of output side resistance lead wirings 51, 52 and 53 extending in the X direction at predetermined intervals. One end of each wiring is open, and the other end thereof is connected to a second resistance lead end 50. The output side resistance lead wirings 51, 52 and 53 are each connected to each of the output wirings 31, 32 and 33 through the contacts 71, 72 and 73, respectively. For example, the output wiring 32 is connected to the output side resistance lead wirings 51, 52 and 53 at connection portions 51a, 52a and 53a (as shown in FIG. 7).

FIG. 8 is a simplified corresponding circuit diagram showing resistance elements of the semiconductor device according to the embodiment. The corresponding circuit of FIG. 8 corresponds to a series of connected elements having resistances between the current input end 20 and the current output end 30, the series including: the input wiring 21 having a resistance value $R_2$, the first resistance element 3 having a resistance value $R_1$, and the output wiring 32 having a resistance value $R_2$. For convenience, the resistances formed by the input wiring 21, the output wiring 32, and the first resistance element 3 defined by the region along Ib-Ib shown in FIG. 6 are shown by the circuit diagram shown in FIG. 8, but each of the input wirings 21, 22 and 23 and each of the output wirings 31, 32 and 33, and the first resistance element connected therebetween, form a plurality of parallel connections between the current input end 20 and the current output end 30. The resistances of each of the input side resistance lead wirings 41, 42 and 43, each of the output side resistance lead wirings 51, 52 and 53, and each of the contacts 61, 62, 63, 71, 72, 73, 81 and 82 are also omitted.

The semiconductor device according to the embodiment includes a plurality of input side resistance lead wirings 41, 42 and 43 that connect predetermined or selected regions of the input wirings 21, 22 and 23 and the first resistance lead end 40, and a plurality of output side resistance lead wirings 51, 52 and 53 that connect predetermined or selected regions of the output wirings 31, 32 and 33 and the second resistance lead end 50. By suitably selecting the input side resistance lead wirings 41, 42 and 43 connected to the first resistance lead end 40 and the output side resistance lead wirings 51, 52 and 53 connected to the second resistance lead end 50, a suitable resistance value and temperature coefficient can be obtained between the first resistance lead end 40 and the second resistance lead end 50.

For example, when the input side resistance lead wiring 41 which is closest to the current input end 20 is selected and connected to the first resistance lead end 40, and the output side resistance lead wiring 53 which is closest to the current output end 30 is selected and connected to the second resistance lead end 50, the wiring length of the input wirings 21, 22 and 23 and the output wirings 31, 32 and 33 which are presented between the first resistance lead end 40 and the second resistance lead end 50 is longer as compared to the case in which another input side resistance lead wiring (42 or 43) and another output side resistance lead wiring (51 or 52) are selected and connected. Accordingly, since the value of the resistance having a positive temperature coefficient between the first resistance lead end. 40 and the second resistance lead end 50 is large, the positive temperature coefficient between the first resistance lead end 40 and the second resistance lead. end. 50 can be increased. The resistance between the first resistance lead end. 40 and the second resistance lead end 50 can be used in a circuit, by connecting to the input end. of an operational amplifier (not shown), for example. A voltage drop occurring between the first resistance lead end 40 and the second resistance lead end 50 in response to an input signal supplied from the current input end 20 can be amplified and output by the operational amplifier.

Figure 9:
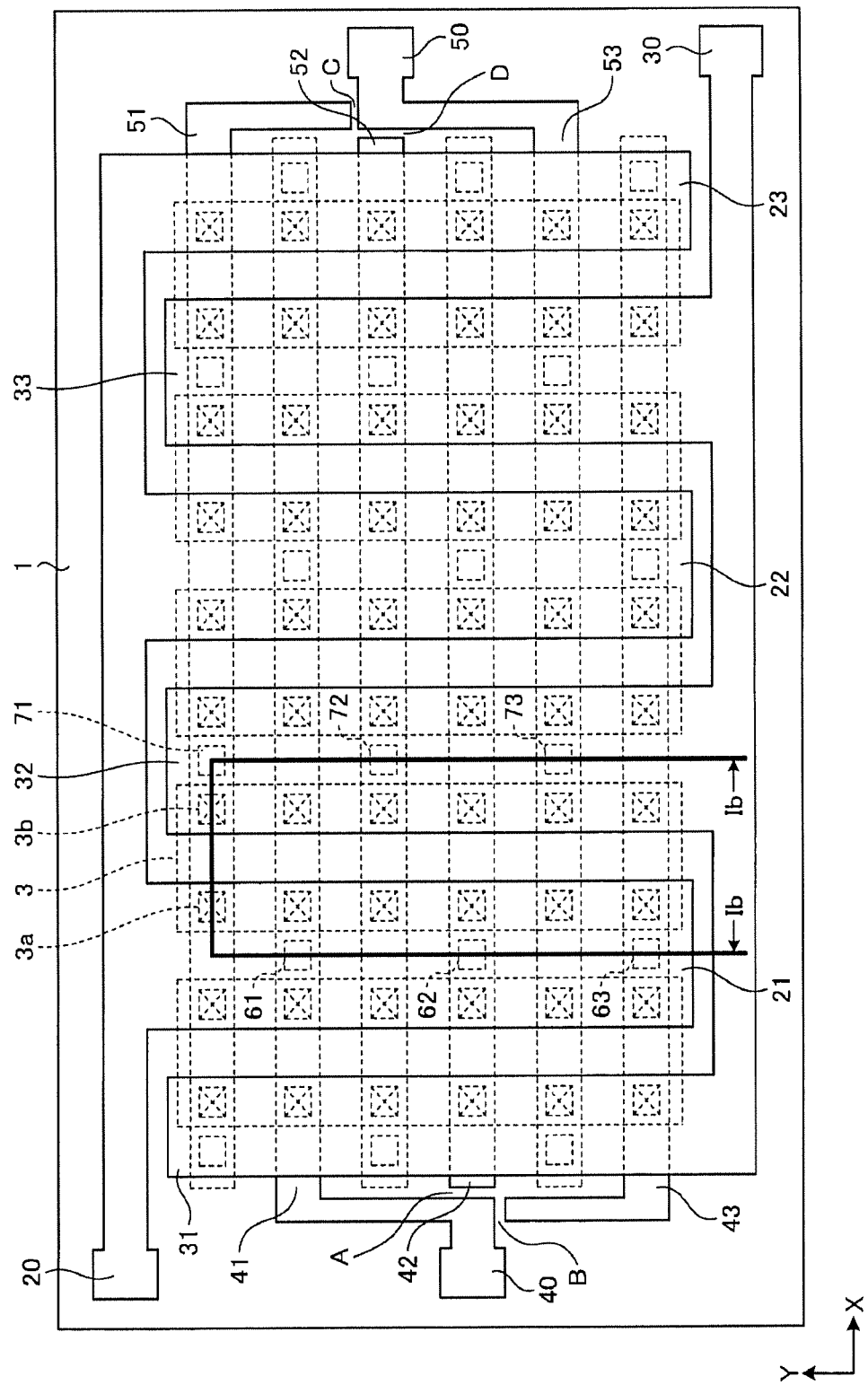
FIG. 9 is a diagram illustrating a method of adjusting the resistance value of a resistance element.

FIG. 9 is a diagram illustrating a method. of adjusting or selecting the resistance value of a resistance element. The components corresponding to the embodiment shown in FIG. 6 are denoted by the same reference numerals. In FIG. 9, among the input side resistance lead wirings 41, 42 and 43, disconnection portions (A, B) are provided on the resistance lead wiring 42 and the resistance lead wiring 43, respectively, and only the input side resistance lead wiring 41 is connected to the first resistance lead end 40. That is, at a position close to the current input end 20, the input wiring 21 is connected to the first resistance lead end 40. Similarly, among the output side resistance lead wirings 51, 52 and 53, disconnection portions (C, D) are provided on the output side resistance lead wiring 51 and the output side resistance lead wiring 52, respectively, and only the output side resistance lead wiring 53 is connected to the second resistance lead end 50. That is, at a position close to the current output end 30, the output side resistance lead end 50 is connected to the output wiring 32. Accordingly, the positive temperature coefficient for the resistance connected between the first resistance lead end 40 and the second resistance lead end 50 can be increased.

For example, a change in the resistance value of the semiconductor device between the current input end 20 and the current output end 30 can be measured by a probe (not shown) while changing the temperature, and based on a measurement result, appropriate resistance lead wiring or wirings 41, 42, 43, 51, 52, and 53 can be selected and connected to the first resistance lead end 40 and the second resistance lead end 50. Thus, whether the positive temperature coefficient should be increased or the negative temperature coefficient should be increased can be determined, and one or more corresponding adjustments can be made. By this adjustment, a resistance having a desired temperature coefficient can be obtained between the first resistance lead end 40 and the second resistance lead end 50.

By forming the input wirings 21, 22 and 23 and the output wirings 31, 32 and 33 out of, for example, aluminum or copper having a small sheet resistance, and a large positive temperature coefficient, the resistance value can be reduced as compared to that of the first resistance element 3. By using the input wirings 21, 22 and 23 and the output wirings 31, 32 and 33 having a smaller resistance value than first resistance element 3, the resistance value between the current input end. 20 and the current output end 30 can be substantially dictated by the resistance value of the first resistance element 3. Therefore, by providing the resistance lead wirings 41, 42, 43, 51, 52 and 53 on the input wirings 21, 22 and 23 and the output wirings 31, 32 and 33, namely by forming a resistance region having a smaller resistance value than that of the first resistance element 3, a resistance having the same resistance value as that set between the current input end 20 and the current output end 30 and having an adjustable or selectable temperature coefficient can be obtained between the first resistance lead end 40 and the second resistance lead end 50.

Note that, when the resistance value of the first resistance element 3 having a negative temperature coefficient is smaller than that of the resistance region having a positive temperature coefficient, a selected region of the first resistance element 3 may be connected to the resistance lead end 40 or 50, such that the negative temperature coefficient is appropriately adjusted or selected. Thus, a desired resistance can be obtained. In this case, for example, a desired resistance can be obtained between the current input end 20 or the current output end 30 and the resistance lead end 40 or 50.

By adjusting or selecting a shape of any of the input wirings 21, 22 and 23 or any of the output wirings 31, 32 and 33, and/or by adjusting or selecting the value of the resistance having a positive temperature coefficient connected between the current input end 20 and the current output end 30, the resistance value and the temperature coefficient between the current input end 20 and the current output end 30 can also be adjusted or selected. Further, not only the resistance between the first resistance lead end 40 and the second resistance lead end 50, but also the resistance between the current input end 20 and the second resistance lead end 50, or the resistance between the first resistance lead end 40 and the current output end 30 can be used as a desired resistance.

Figure 10:
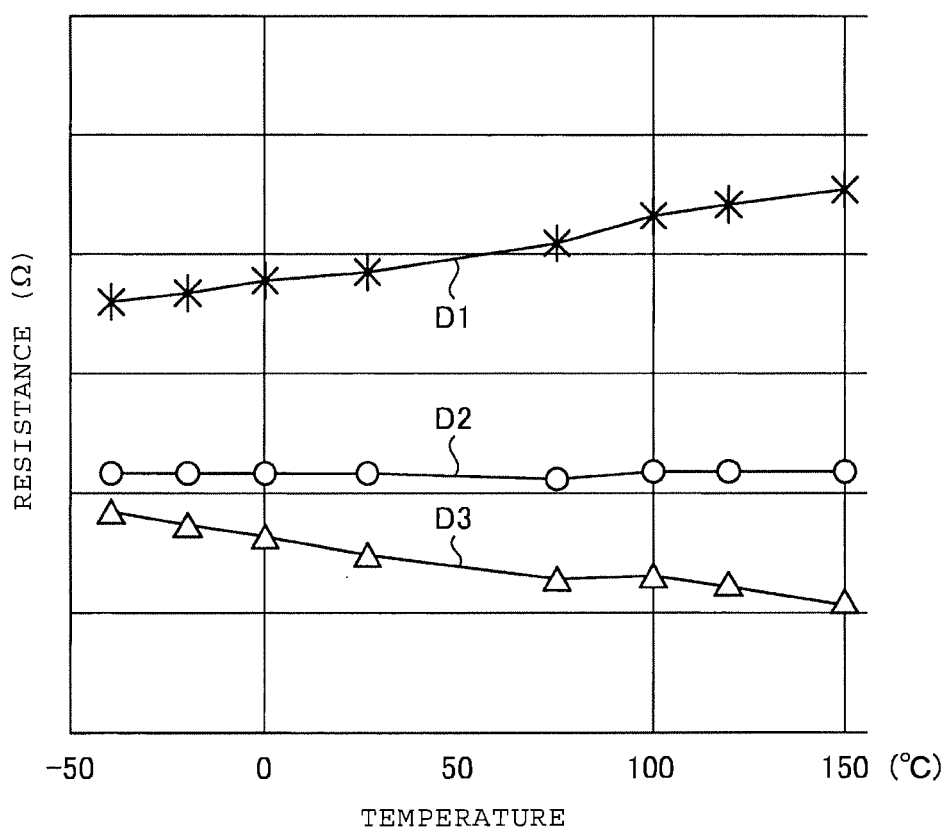
FIG. 10 is a diagram showing the measurement result of the resistance value of a resistance element.

FIG. 10 is a diagram showing a measurement result of the resistance of a resistance element. In FIG. 10, the solid line D1 shows a case in which the resistance lead wirings 41 and 53, which are closer to the current input end 20 and the current output end 30 than other wirings may be, are connected to the first and second resistance lead ends 40 and 50. The solid line D3 shows a case in which the resistance lead wirings 43 and 51, which are farther from the current input end 20 and the current output end 30 than other wirings may be, are connected to the first and second resistance lead ends 40 and 50. The solid line D2 shows a case in which the resistance lead wirings 42 and 52, which are at a middle distance from the current input end 20 and the current output end 30 as compared to the more distant wirings 43 and 51 and the closer wirings 41 and 53, are connected to the first and second resistance lead ends 40 and 50. The value of TCR can be adjusted every several parts-per-million ("ppm")/° C. to tens of ppm/° C., in the range of about ±500 ppm/° C. Without changing the resistance region connected between the current input end 20 and the current output end 30, by changing the combination of resistance lead wirings connected to the first and second resistance lead ends 40 and 50, it is possible to obtain a desired resistance and an appropriate temperature coefficient.

While certain embodiments have been described, these embodiments have been presented by way of example only, and are not intended to limit the scope of the present disclosure. Indeed, the embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure. Moreover, some or all of the above described embodiments can be combined when implemented.

What is claimed is:

1. A semiconductor device, comprising:
   a plurality of first wirings, each first wiring having a first side surface and a second side surface opposite to the first side surface;
   a second wiring;
   a first number of first resistance elements that are connected in parallel between at least one first wiring of the plurality of first wirings and the second wiring, each first resistance element having a negative first temperature coefficient; and
   a second number of second resistance elements that are connected in parallel to the first resistance elements, and each of which has a positive second temperature coefficient, the second temperature coefficient having an absolute value larger than an absolute value of the first temperature coefficient;
   wherein the second number is smaller than the first number,
   wherein adjacent pairs of the first wirings are spaced from each other,
   wherein the second wiring is provided between at least two of the first wirings, the second wiring having a third side surface that faces a first side surface of one of the first wirings, and having a fourth side surface opposite to the third side surface that faces a second side surface of another of the first wirings.

2. The device according to claim 1, wherein a length of each second resistance element is longer than a length of each first resistance element, and a width of each second resistance element is narrower than a width of each first resistance element.

3. A semiconductor device, comprising:
   a semiconductor substrate;
   a plurality of contacts;
   a first insulating layer provided above the semiconductor substrate;
   a second insulating layer provided above the first insulating layer;
   a third insulating layer provided above the second insulating layer;
   a second resistance element provided in the first insulating layer having a positive second temperature coefficient;
   a first resistance element provided in the second insulating layer having a negative first temperature coefficient, the second temperature coefficient having an absolute value larger than an absolute value of the first temperature coefficient;
   a first wiring provided in the third insulating layer, to which one end of the first resistance element is connected through at least one of the plurality of contacts and to which one end of the second resistance element is connected through at least one of the plurality of contacts; and
   a second wiring provided in the third insulating layer, to which another end of the first resistance element is connected through at least one of the plurality of contacts and to which another end of the second resistance element is connected through at least one of the plurality of contacts.

4. The device according to claim 3, wherein the first resistance element comprises a semiconductor material, and the second resistance element comprises a metal material.

5. The device according to claim 4, wherein the first resistance element comprises tantalum nitride, and the second resistance element comprises copper or aluminum.

6. The device according to claim 3, wherein a length of the second resistance element is longer than a length of the first resistance element, and a width of the second resistance element is narrower than a width of the first resistance element.

7. A semiconductor device, comprising:
   a first terminal;
   a second terminal;
   a first resistance element having a negative temperature coefficient and a second resistance element having a positive temperature coefficient which are connected in series between the first terminal and the second terminal;
   a resistance lead end;
   a plurality of lead wirings that connect a plurality of regions in the second resistance element to the resistance lead end;
   wherein the second resistance element has a smaller resistance value than the first resistance element;
   wherein the second resistance element comprises a wiring that connects the first resistance element to the first terminal.

8. The device according to claim 7, wherein the first resistance element comprises a semiconductor material, and the second resistance element comprises a metal material.

9. The device according to claim 8, wherein the first resistance element comprises tantalum nitride, and the second resistance element comprises copper or aluminum.

10. A semiconductor device, comprising:
    a first terminal;
    a second terminal;
    a first resistance lead end;
    a second resistance lead end;
    a first resistance region forming a first resistance having a negative temperature coefficient;
    a first wiring region having a positive temperature coefficient, and connecting the first resistance region to the first terminal;
    a second wiring region having a positive temperature coefficient, and connecting the first resistance region to the second terminal;
    a first lead wiring that connects a region in the first wiring region to the first resistance lead end; and
    a second lead wiring that connects a region in the second wiring region to the second resistance lead end.

11. The device according to claim 10, wherein the first wiring region comprises a plurality of first wiring branches, and adjacent pairs of the first wiring branches are spaced from each other.

12. The device according to claim 11, wherein:
   each first wiring branch has a first side surface and a second side surface opposite to the first side surface, and
   the second wiring region comprises a second wiring branch that is provided between at least two of the first wiring branches, the second wiring branch having a third side surface that faces a first side surface of one of the first wiring branches, and having a fourth side surface opposite to the third side surface that faces a second side surface of another of the first wiring branches.

13. The device according to claim 10, wherein the first resistance region comprises a semiconductor material, and the second resistance region comprises a metal material.

14. The device according to claim 13, wherein the first resistance region comprises tantalum nitride, and the second resistance region comprises copper or aluminum.

15. The device according to claim 10, further comprising:
   a plurality of first lead wirings that each connect a different region in the first wiring region to the first resistance lead end; and
   a plurality of second lead wirings that each connect a different region in the second wiring region to the second resistance lead end.

\* \* \* \* \*